(12) United States Patent
Schunk et al.

(10) Patent No.: US 6,869,232 B2
(45) Date of Patent: Mar. 22, 2005

(54) RECEIVING AND COUPLING PART FOR OPTO-ELECTRONIC TRANSMISSION AND/OR RECEPTION ELEMENT

(75) Inventors: Nikolaus Schunk, Maxhütte-Haidhof (DE); Josef Wittl, Parsberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/667,260

(22) Filed: Sep. 19, 2003

(65) Prior Publication Data

US 2004/0061956 A1 Apr. 1, 2004

Related U.S. Application Data

(63) Continuation of application No. PCT/DE02/00903, filed on Mar. 8, 2002.

(51) Int. Cl.[7] .............................................. G02B 6/42
(52) U.S. Cl. ........................................... 385/93; 385/92
(58) Field of Search ..................................... 385/88–94

(56) References Cited

U.S. PATENT DOCUMENTS 4,410,469 A * 10/1983 Katagiri et al. ............... 385/88
6,309,566 B1 10/2001 Müller et al.
6,733,189 B2 * 5/2004 Hurt et al. ..................... 385/92
2004/0008952 A1 * 1/2004 Kragl ............................ 385/88

FOREIGN PATENT DOCUMENTS

| DE | 199 09 242 A1 | 8/2000 |
| EP | 0 053 483 A2 | 6/1982 |
| WO | 98/06141 | 2/1998 |

* cited by examiner

Primary Examiner—Akm Enayet Ullah
Assistant Examiner—Omar Rojas
(74) Attorney, Agent, or Firm—Laurence A. Greenberg; Werner H. Stemer; Ralph E. Locher

(57) ABSTRACT

The invention relates to a receiving and coupling part for an optoelectronic transmission and/or reception element having an opening for inserting a carrier on which the transmission and/or reception element is disposed, having a casting material that surrounds the transmission and/or reception element, and having a coupling region for the coupling of an optical fiber. The receiving and coupling part includes a cylindrical recess, one end of which contains the transmission and/or reception element, and the other end of which serves for the receiving and coupling of an optical fiber. The receiving and coupling part makes possible the arranging of the transmission and/or reception element in a transparent casting compound and the coupling of an optical fiber in a simple manner and exhibits a high degree of stability with respect to temperature fluctuations.

30 Claims, 17 Drawing Sheets

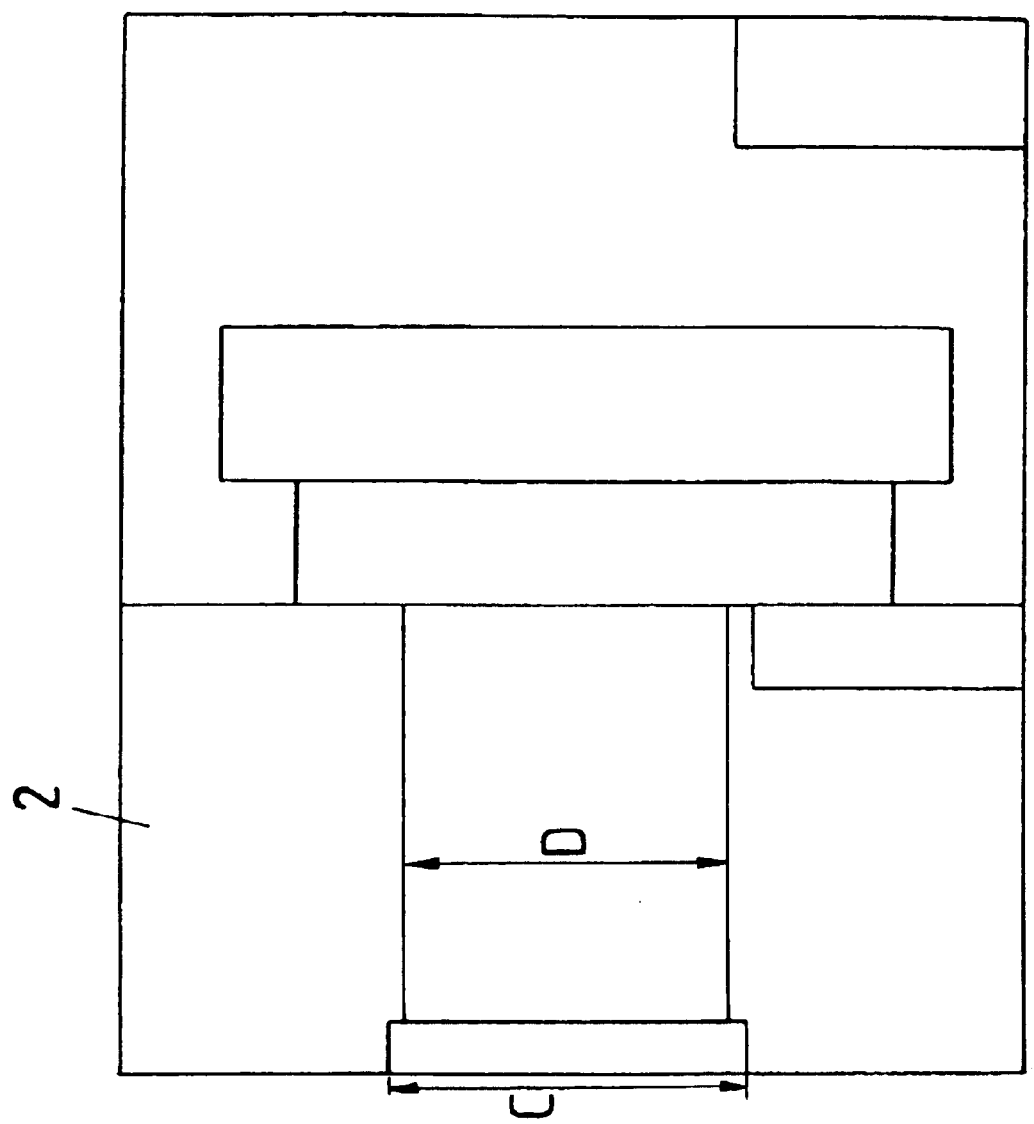
Fig. 3
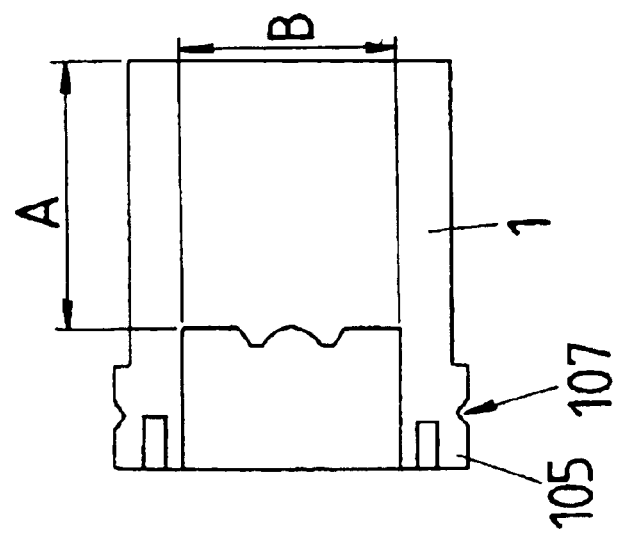

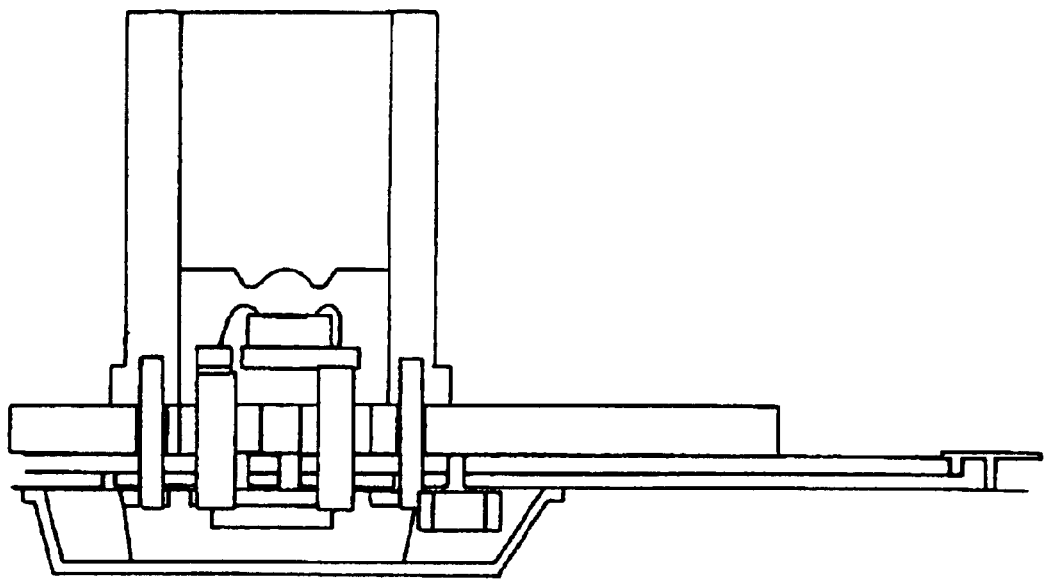
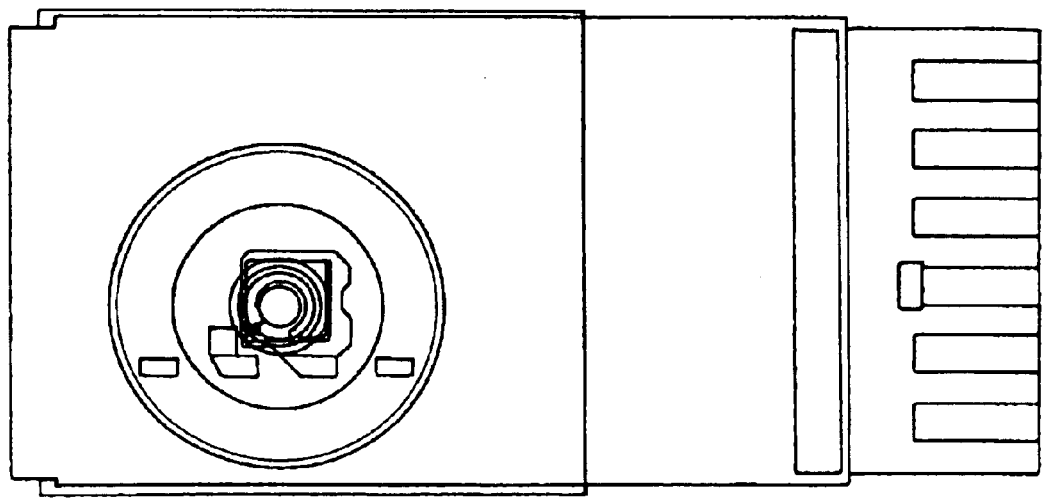
Fig. 6

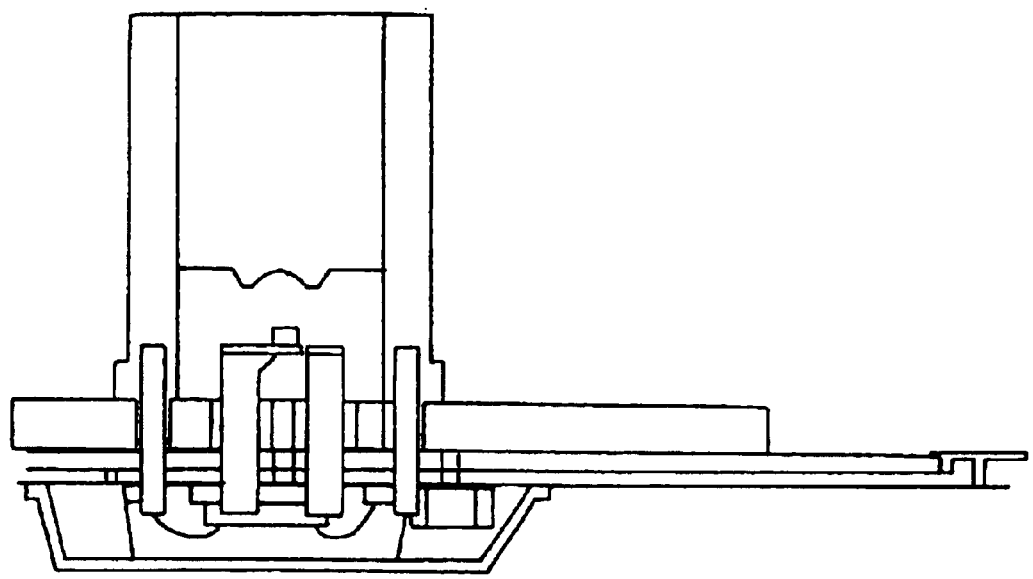
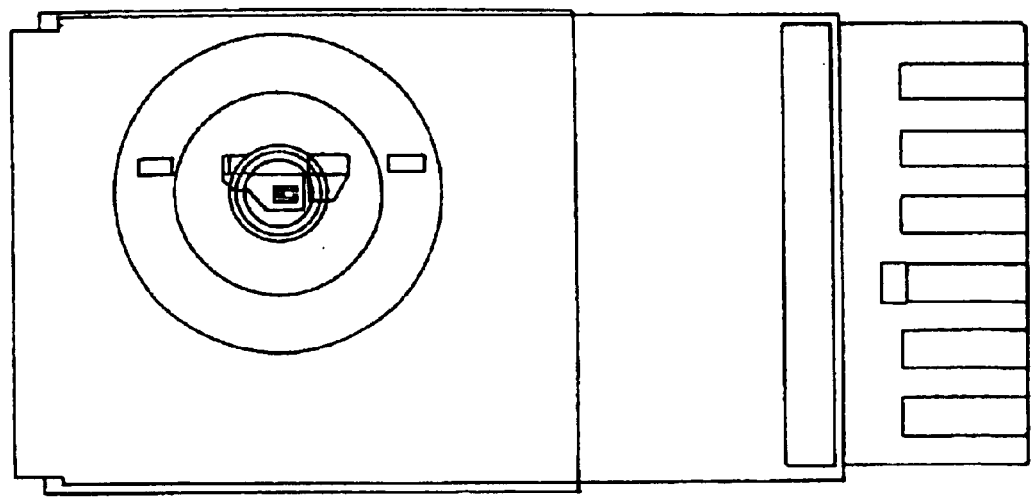
Fig. 7

RECEIVING AND COUPLING PART FOR OPTO-ELECTRONIC TRANSMISSION AND/OR RECEPTION ELEMENT

CROSS-REFERENCE TO RELATED APPLICATION

This application is a continuation of copending International Application No. PCT/DE02/00903, filed Mar. 8, 2002, which designated the United States and was not published in English.

BACKGROUND OF THE INVENTION

Field of the Invention

The invention relates to a receiving and coupling part for an opto-electronic transmission and/or reception element. The receiving and coupling part with a corresponding transmission and/or reception element is preferably part of an inexpensive opto-electronic module that is coupled with a POF (plastic optical fiber).

Published German Patent Application DE 199 09 242 A1 describes an opto-electronic module having a carrier with an optoelectronic converter positioned in a modular housing. The carrier is surrounded by a transparent moldable material that protects the optical and electrical components from environmental influences. A relatively long processing time is required for curing because of a relatively large casting volume. Another disadvantage is that differences in the coefficients of expansion of the carrier, components, and casting compound result in a limited stability with respect to temperature fluctuations, and stresses arise. The larger the housing and the packaged parts are, the greater the resulting stresses are.

In the known housing, an angle of 90° exists between the casting opening of the housing and the optical axis of a coupling region for accepting an optical fiber. This can cause problems in the production of lenses in the molding body, since an air bubble will form given an incomplete filling of the lens mold, which sharply reduces the effectiveness of the lens.

SUMMARY OF THE INVENTION

It is accordingly an object of the invention to provide a receiving and coupling part for a transmission and/or reception element, which overcomes the above-mentioned disadvantages of the prior art apparatus of this general type.

In particular, it is an object of the invention to provide a receiving and coupling part enabling a transmission and/or reception element to be configured in a transparent casting compound and enabling an optical fiber to be easily coupled. It is another object of the invention to provide a receiving and coupling part that has a large measure of stability against temperature fluctuations. At the same time, the formation of air bubbles at a lens that is integrated into the casting compound must be prevented to the greatest possible extent.

With the foregoing and other objects in view there is provided, in accordance with the invention, a receiving and coupling unit formed with a cylindrical recess, one end of which contains the transmission and/or reception element, and the other end of which serves for receiving and coupling an optical fiber. The receiving and coupling part thus substantially includes a cylinder having an end at which the molding body is formed. The receiving and coupling part is thus provided with a simple symmetrical and inexpensive structure.

The filling of the receiving and coupling part with the casting material can proceed in the direction of the optical axis of the cylindrical recess, i.e. in the direction of the cylinder axis. The other end of the cylinder is sealed on the bottom with a stamp having a negative lens shape. The positive lens shape forms therein by means of molding. Because the casting body is formed directly in the cylindrical recess at which the optical fiber will be coupled, the casting material can be kept as small as possible, and consequently stresses based on different coefficients of expansion are reduced. In addition, the curing time is shortened accordingly. Because the casting direction coincides with the optical axis and is not at a 90° angle to the axis as in the prior art, the lens is always completely filled with casting material during the filling process, which eliminates the risk of air bubbles remaining in the lens region.

Alternatively, it can also be provided that a carrier and, during the filling process, the casting compound as well, are inserted by way of an opening in the wall of the cylindrical recess at an angle of 90° to the optical axis. In this variant of the invention, one end of the cylindrical recess is preferably provided with a sealing cap. The wall of the receiving and coupling part preferably consists of a conductive plastic material and/or is sheathed in a conductive electrical layer. The electromagnetic radiation in the optical transmission element is thus absorbed and can exit the open part (i.e. the coupling region) of the receiving and coupling part only in a highly dampened form. The cylindrical recess thus acts something like a hollow conductor that is being driven far above the cut-off wavelength.

The carrier is preferably a leadframe. The receiving and coupling part can preferably be connected to ground lines by way of the leadframe. The lines are inserted into the receiving and coupling part in such a way that an optical transmission and reception element can be aligned in all three dimensions relative to the optical axis and the exterior dimensions of the receiving and coupling part. Moldings are therefore provided, which set the optical elements and the optical axis in relation to the outer diameter of the receiving and coupling part in a simple joining step. The positioning of the optical element on the leadframe thus occurs with a high position precision relative to the optical axis.

The inner diameter of the cylindrical recess matches the outer diameter of an optical fiber that is to be coupled. By the insertion of the optical fiber—which is a plastic fiber, an HPCS/HCS fiber, or a multimode glass fiber with a core diameter of 50 $\mu$m—into the receiving and coupling part, the optical fiber is securely held on the optical axis.

In a preferred development of the invention, the leadframe extends parallel to the optical axis of the cylindrical recess of the receiving and coupling part. To a certain extent, it is thus led away from the back of the receiving and coupling part. The advantage of this is the small dimension of the receiving and coupling part perpendicular to the optical axis. The disadvantage is that, with the leadframe aligned parallel to the optical axis of the cylindrical recess, the optical transmission and/or reception element must be mounted on a portion of the leadframe that is bent 90°.

In an alternative development, the leadframe is installed vertical to the optical axis of the cylindrical recess. That way, the optical converters can be built on a planar leadframe.

According to a preferred development of this variant, the leadframe, outside the receiving surface for the optical transmission and/or reception element, is bent in the shape of an S prior to a filling of the receiving and coupling part, namely the cylinder, in the direction of the optical axis. This guarantees that the receiving surface for the optical transmission and/or reception element protrudes into the interior of the cylindrical recess.

The receiving and coupling part, which, as described above, either consists of an electrically conductive material or possesses a galvanically applied metal sheathing, is either non-conductive or is insulated from the leadframe at the location where the leadframe is led out of the receiving and coupling part vertically to the longitudinal axis.

For the purpose of positioning the leadframe, passive aligning structures are preferably provided at the receiving and coupling part and the leadframe, which interlock.

In a preferred development, the optical transmission and/ or reception elements are installed on a completely planar leadframe, not an S-shaped leadframe. The planar leadframe is led into the cylindrical recess through a side opening in the wall of the receiving and coupling part. It is positioned exactly on the optical axis of the cylindrical recess.

The receiving and coupling part is cylindrical in the region of the fiber guidance, so that the optical fiber is led in the inner cylinder. The receiving and coupling part can be fixed in a plug housing by the outer cylinder. The receiving and coupling part includes passive aligning marks for the assembling of the receiving and coupling part at a plug housing and/or circuit board.

It can be further provided that ridges for mechanical locking are installed on the outer cylinder, i.e. on the exterior of the wall of the cylindrical recess. That way, the receiving and coupling part can be prevented from sliding out during its assembly at a plug housing. Such locking devices, which are U-shaped, for example, can be constructed differently for a receiving and coupling part with a transmission element or with a reception element. A locking mechanism could also be provided in an annular form on the exterior wall by a small wedge-shaped elevation.

It is not always necessary to use two separate receiving and coupling parts for realizing the transmission and reception components of a transceiver. It can also be provided that the receiving and coupling part is constructed as a double chamber including the transmission and reception elements in separate parallel regions. The spacing of the two cylinder axes corresponds to the spacing of the two axes of the optical fiber of a mechanical plug system. Locking with a clock type rotation is then no longer possible. Locking occurs by using a wedge shaped ring structure on the two outer cylinders, for example.

A passive alignment is provided in this exemplary embodiment by the dimensions of the two outer cylinders, which fit positively into the corresponding recesses at an appertaining plug housing. In order to suppress an electrical crosstalk from the transmission converter onto the reception converter, the connecting wall between the two chambers is electrically conductive. This can be realized by using an electrically conductive casting compound, for example.

Another embodiment provides openings in the connecting wall for preventing electrical crosstalk. These openings are constructed such that they are coated or filled with an electrically conductive layer, and they represent a metallically conductive wall for the electromagnetic radiation.

Other features which are considered as characteristic for the invention are set forth in the appended claims.

Although the invention is illustrated and described herein as embodied in a receiving and coupling part for optoelectronic transmission and/or reception element, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a sectional view taken through another exemplary embodiment of a receiving and coupling part together with a plug housing that can be placed on the receiving and coupling part;

FIG. 6 are front and sectional views of a fully assembled receiving embodiment of a receiving and coupling part;

FIG. 7 are front and sectional views of a fully assembled transmission embodiment of a receiving and coupling part;

DESCRIPTION OF THE PREFERRED EMBODIMENTS

Figure 1:
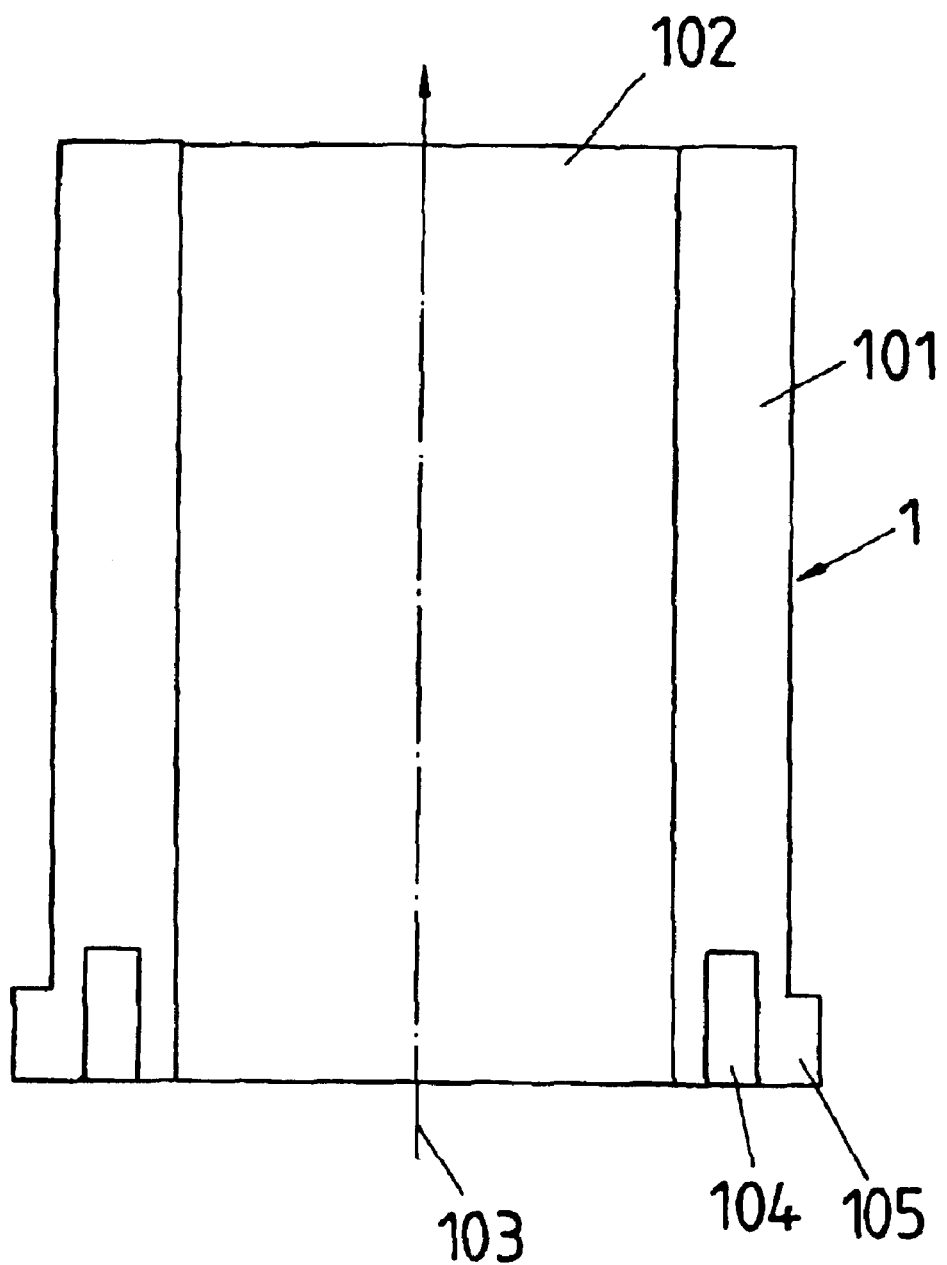
FIG. 1 is a sectional view showing the basic structure of a receiving and coupling part.

Referring now to the figures of the drawing in detail and first, particularly, to FIG. 1 thereof, there is shown the basic components of a receiving and coupling part. These components consist of a cylinder 1, which includes a wall 101 that defines a cylindrical recess 102 and surrounds the recess 102. The cylinder 1 is symmetrically constructed and includes an optical axis 103. The axis 103 forms the optical axis of a transmission or reception element that is disposed in the receiving and coupling part in a casting material. The cylinder 1 consists of a conductive injection molding material or is surrounded by an electrically conductive sheathe.

For receiving a leadframe that forms a carrier and that includes the respective optical converter element (for instance a photodiode or RCLED), the receiving and coupling part is provided with receiving sockets 104, and the cylinder wall is reinforced in this region 105. Ground pins of the leadframe are inserted into the receiving sockets 104. These ground pins guarantee the ground connection of the receiving and coupling part with the printed circuit board for ground shielding purposes.

The receiving and coupling part is also referred to as a CAI (cavity-AS interface) housing that serves for receiving a transmission and/or reception element disposed on a carrier in a casting material and also for coupling an optical fiber. The receiving and coupling part is referred to as the CAI housing hereinafter.

Figure 2:
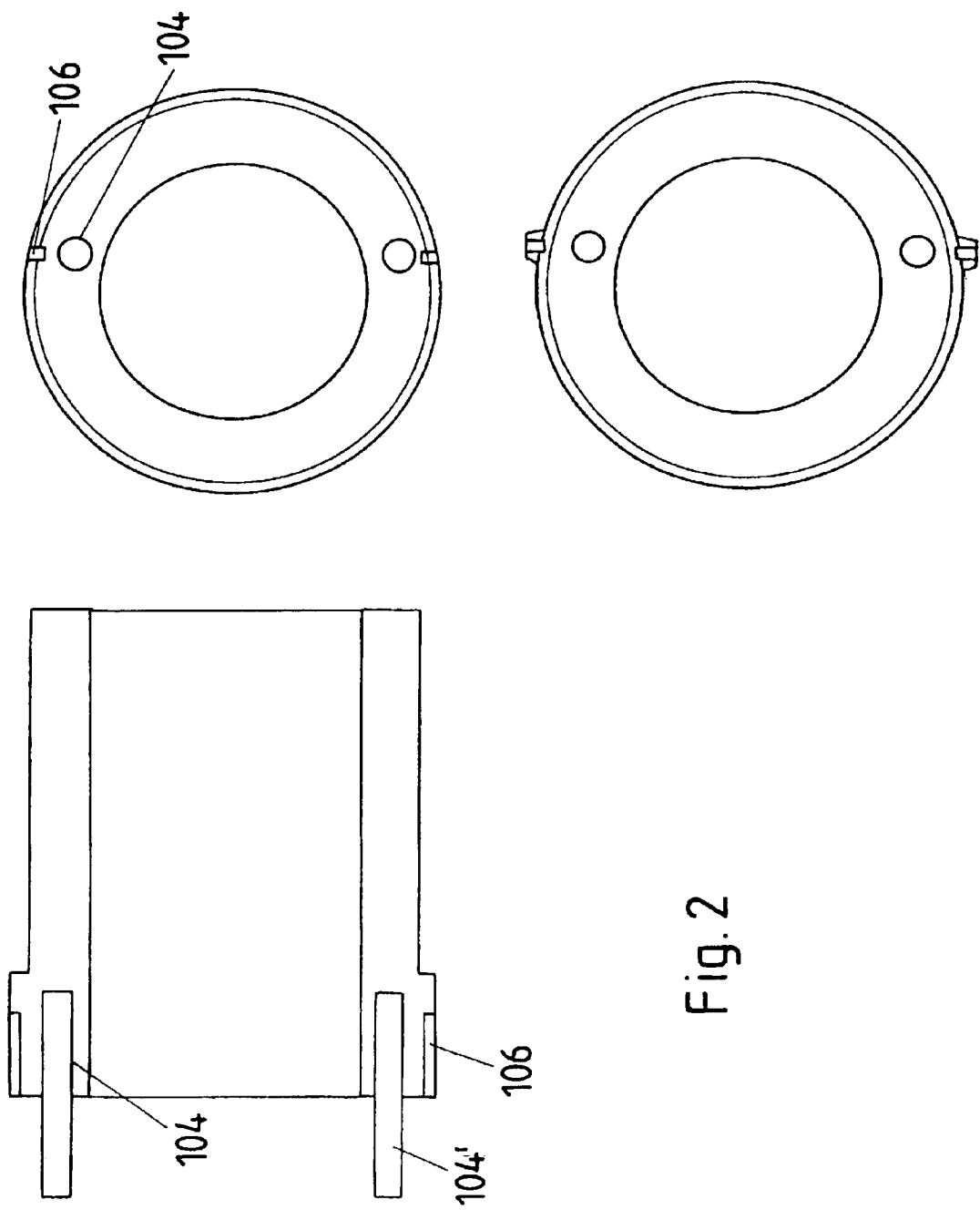
FIG. 2 is a sectional side view and a plan view of the receiving and coupling part constructed as shown in FIG. 1, but with ground pins thereon.

FIG. 2 shows slight variants in which the ground pins 104' are co-injected directly when fabricating the CAI housing. The aligning of a leadframe then occurs by way of guide slots 106 at the margin region of the cylinder 1.

All geometric dimensions are defined by the CAI housing with reference to optically coupling an optical fiber. Thus, the dimensions of the outer diameter, inner diameter, and open path distance to the casting body in the CAI housing represent a standardized mechanical interface to a plug that is to be attached. The dimension of a plug housing must match the dimensions of the CAI housing so that the CAI housing can be fit into a plug housing.

FIG. 3 shows the essential dimensions A, B, C, D that must be transferred from the CAI housing into a plug housing 2.

In the exemplary embodiment shown in FIG. 3, the cylinder 1 also has a reinforced region 105. A positive region, for instance a surrounding trench 107 is provided, which allows the locking of the cylinder 1 of the CAI housing in the wall of the plug housing 2. Completely surrounding the CAI housing by the plug housing 2 is therefore unnecessary. Rather, the cylinder 1 of the CAI housing can protrude into the plug housing 2 freely like a beak.

Figure 4:
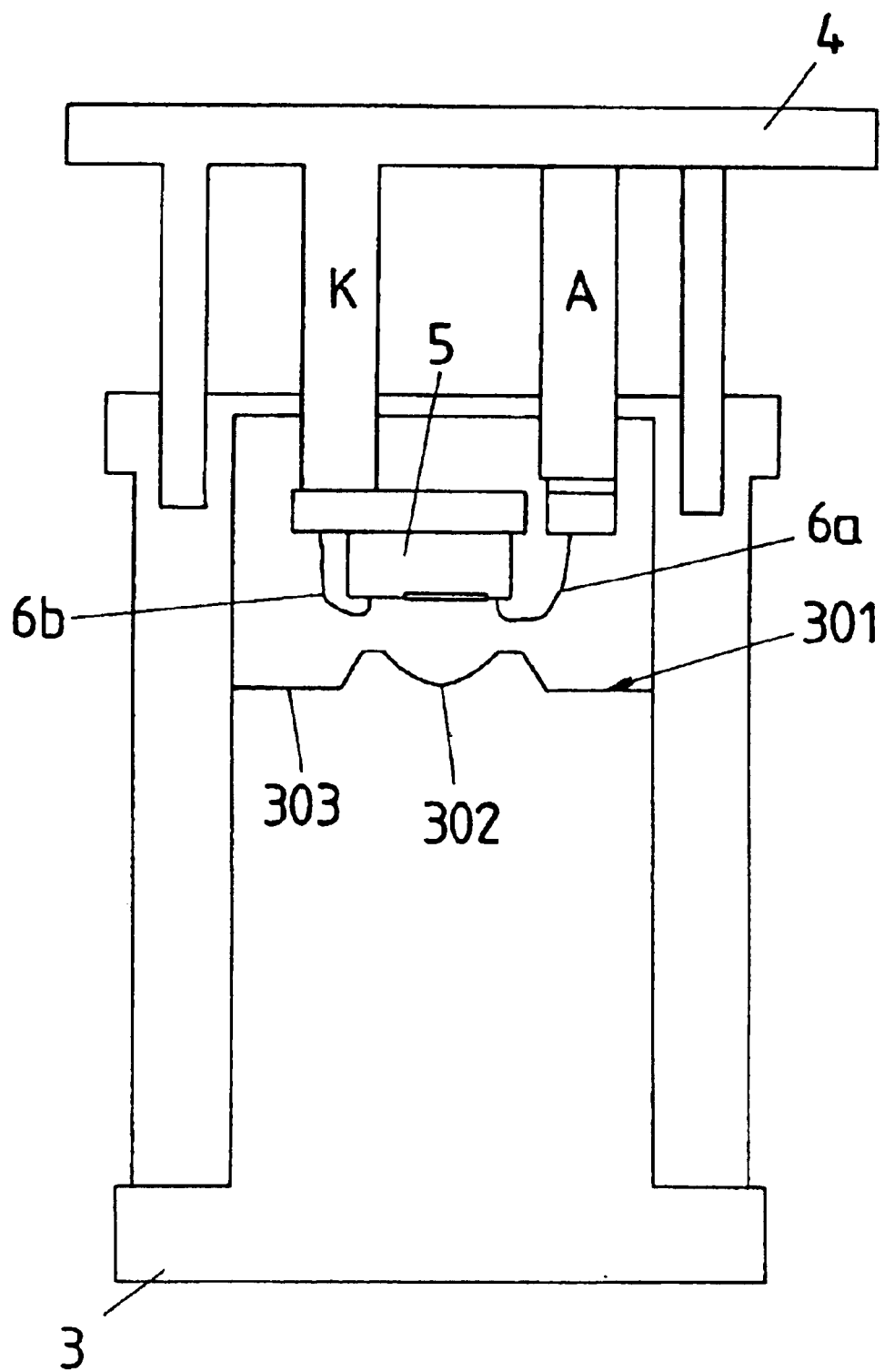
FIG. 4 is a sectional view taken through a receiving and coupling part during the arranging of a photodetector.

FIG. 4 shows a section through a structure for fabricating a photodetector. The CAI housing with the cylinder 1 is sealed on the bottom by a stamp 3. A coupling lens 302 is constructed on the stamp surface 301 in negative form and with a fiber stop locking mechanism. The fiber stop locking mechanism, a fiber stop ring to be exact, is constructed in the outer region and includes a nose 303 with a length of 50 µm relative to the lens vertex. A leadframe 4 with a photodiode 5 has been immersed in the casting body and is cured. The cylinder interior is filled with a casting compound in the direction of the optical axis, i.e. from above.

The leadframe forms a cathode contact K and an anode contact A, which extend in the direction of the optical axis. The photodiode 5 is contacted using bond wires 6a, 6b, respectively.

Figure 5:
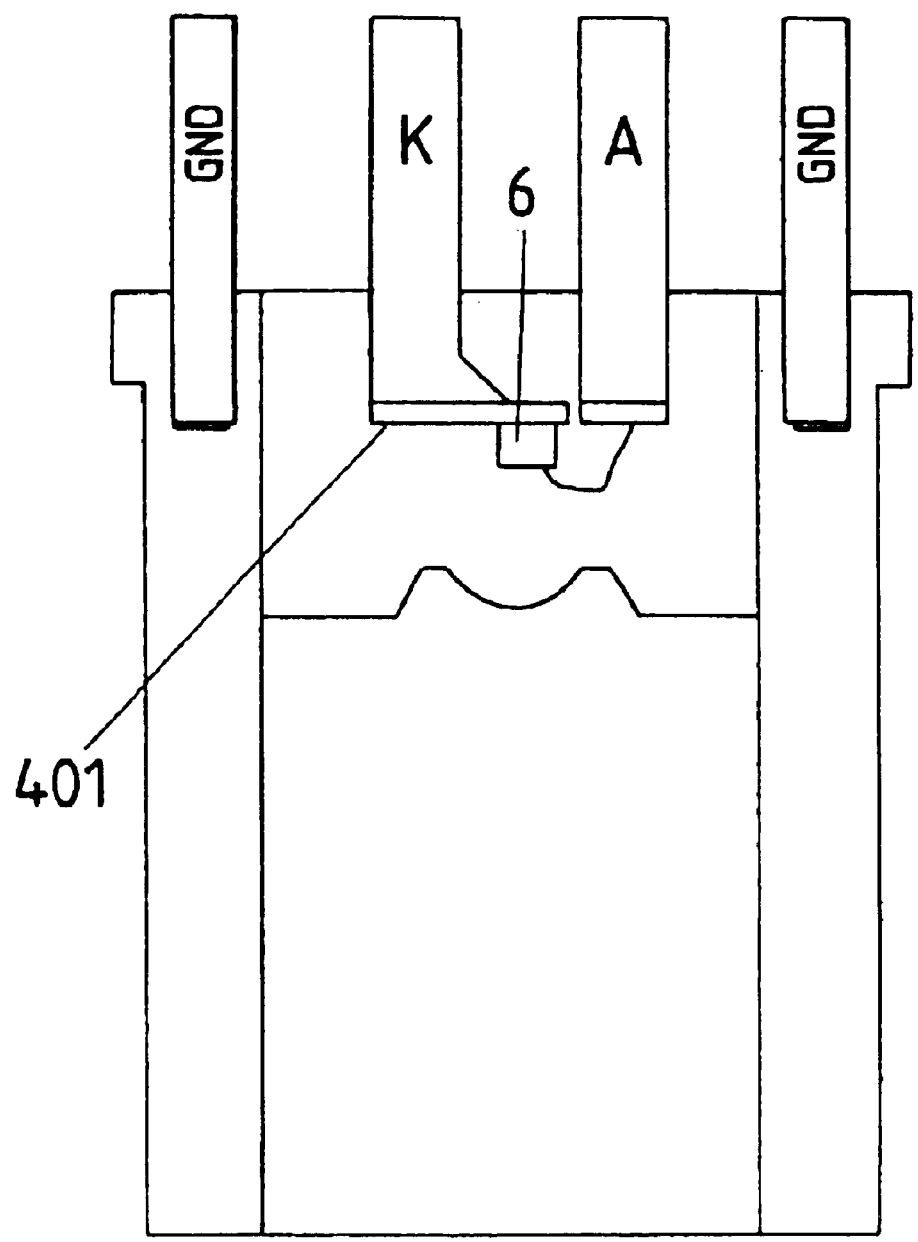
FIG. 5 is a sectional view taken through a receiving and coupling part while configuring a transmission element and subsequent to separating the leadframe.

FIG. 5 shows a configuration corresponding to the configuration of FIG. 4, but with a transmission element 6. It is noted that the leadframe with the contact elements K, A forms a 90° angled region 401 on which the transmission element 6, or the reception element 5 in FIG. 4, is mounted.

FIG. 6 shows front and sectional views of the CAI housing constructed in a receiver embodiment and mounted on an Al-laminated flex film circuit carrier. The "optics" are limited to the region of the transparent casting body. The electrical wiring is realized as known in the prior art. The Al film serves for shielding against electromagnetic radiation as well as for heat removal.

FIG. 7 shows a CAI housing constructed in a transmission embodiment and mounted on an Al-laminated flex film circuit carrier.

Figure 8:
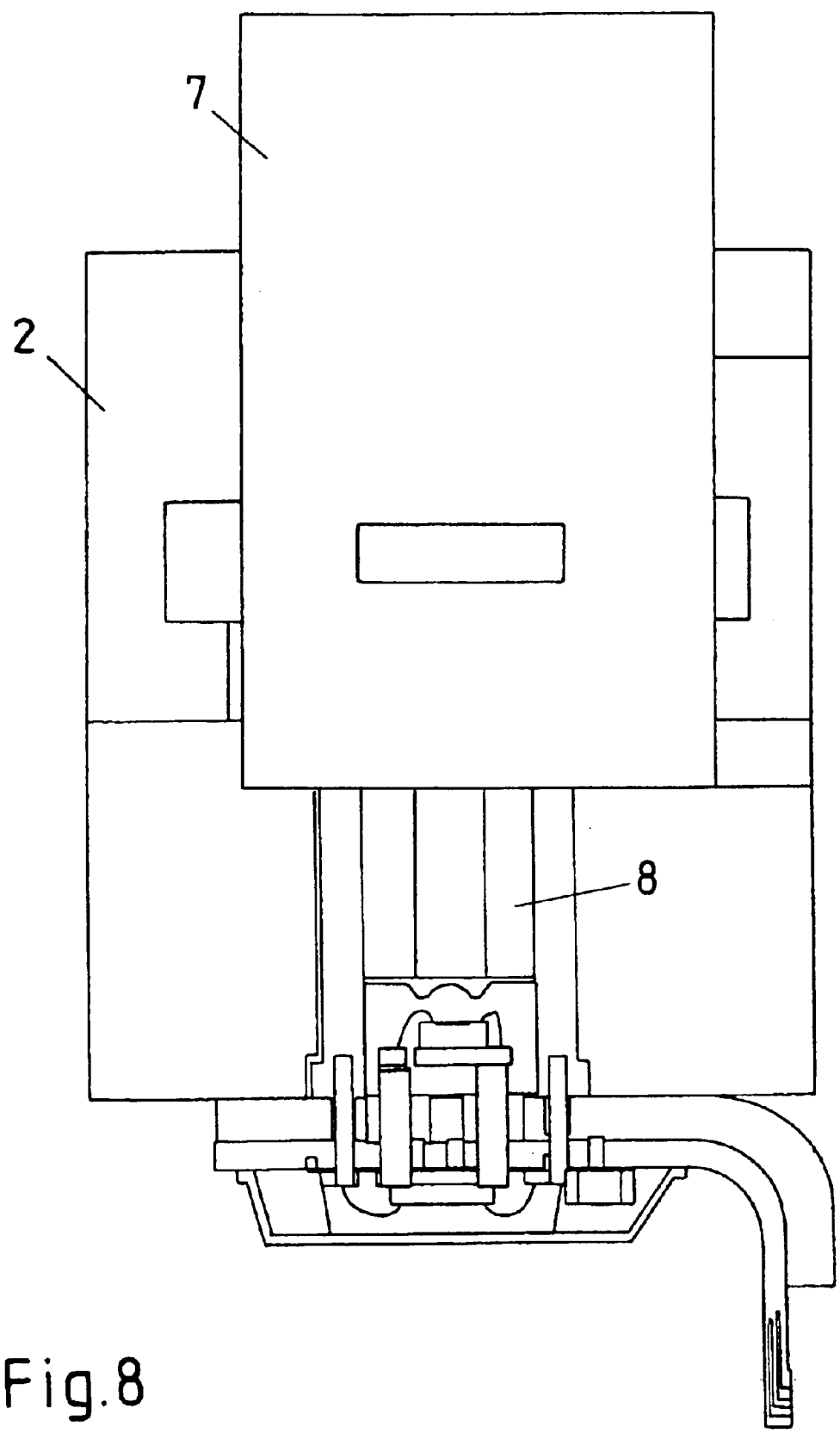
FIG. 8 is a schematic view showing the coupling of a receiving and coupling part in a plug housing.

FIG. 8 shows the CAI housing constructed in a receiver embodiment with an SMI (small multimedia interface) plug housing 2. An attached POF (plastic optical fiber) plug 7 with an optical fiber 8 is inserted into the CAI housing and fixed in place exclusively by the dimension of the CAI housing. A mechanical interface exists. With this design, any form of plug can be provided with an optical transceiver consisting of a transmitting and receiving module, while at the same time the standardized mechanical dimension of the CAI housing is preserved.

Figure 9:
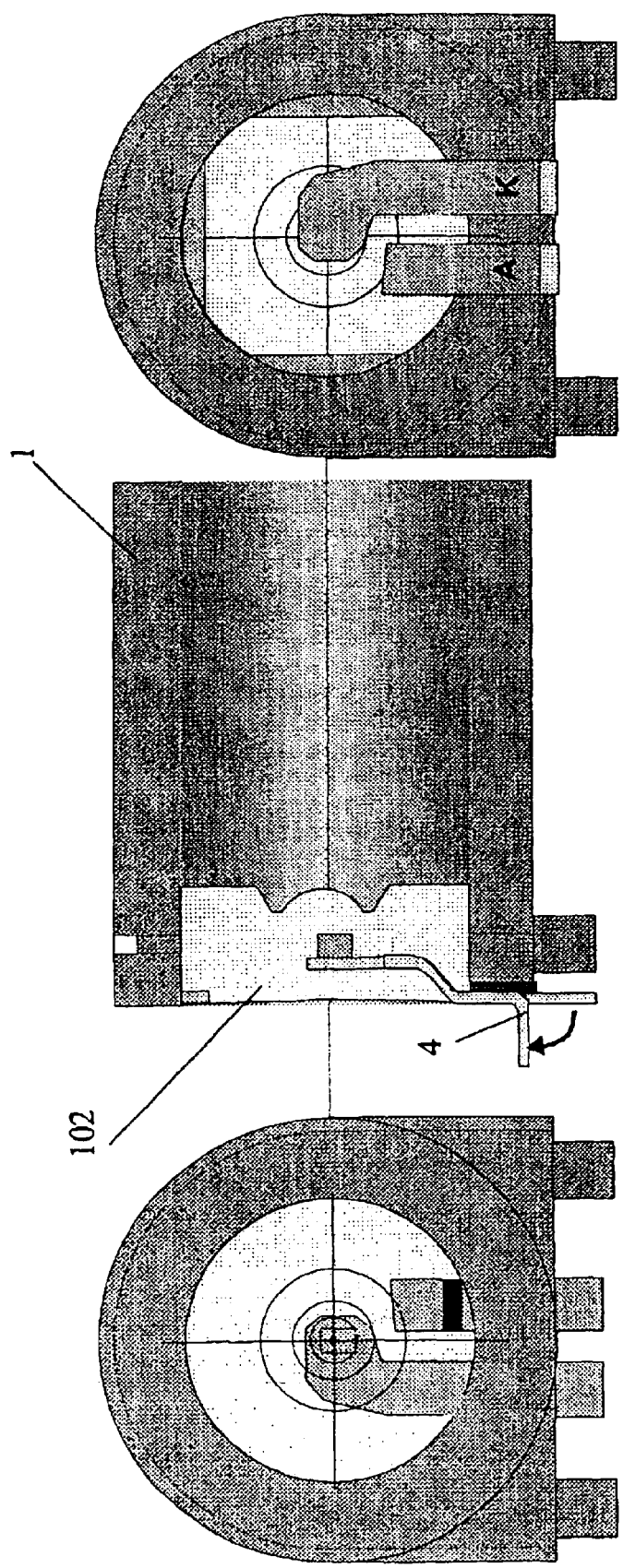
FIG. 9 are side, rear, and front views of another exemplary embodiment of a receiving and coupling part.

FIG. 9 shows an exemplary embodiment wherein the leadframe 4 is led from the cylinder 1 vertically relative to the optical axis. The leadframe is therein bent into an S shape, so that it protrudes in the interior of the cylindrical recess 102 and is completely covered during the filling with a casting material.

Figure 10:
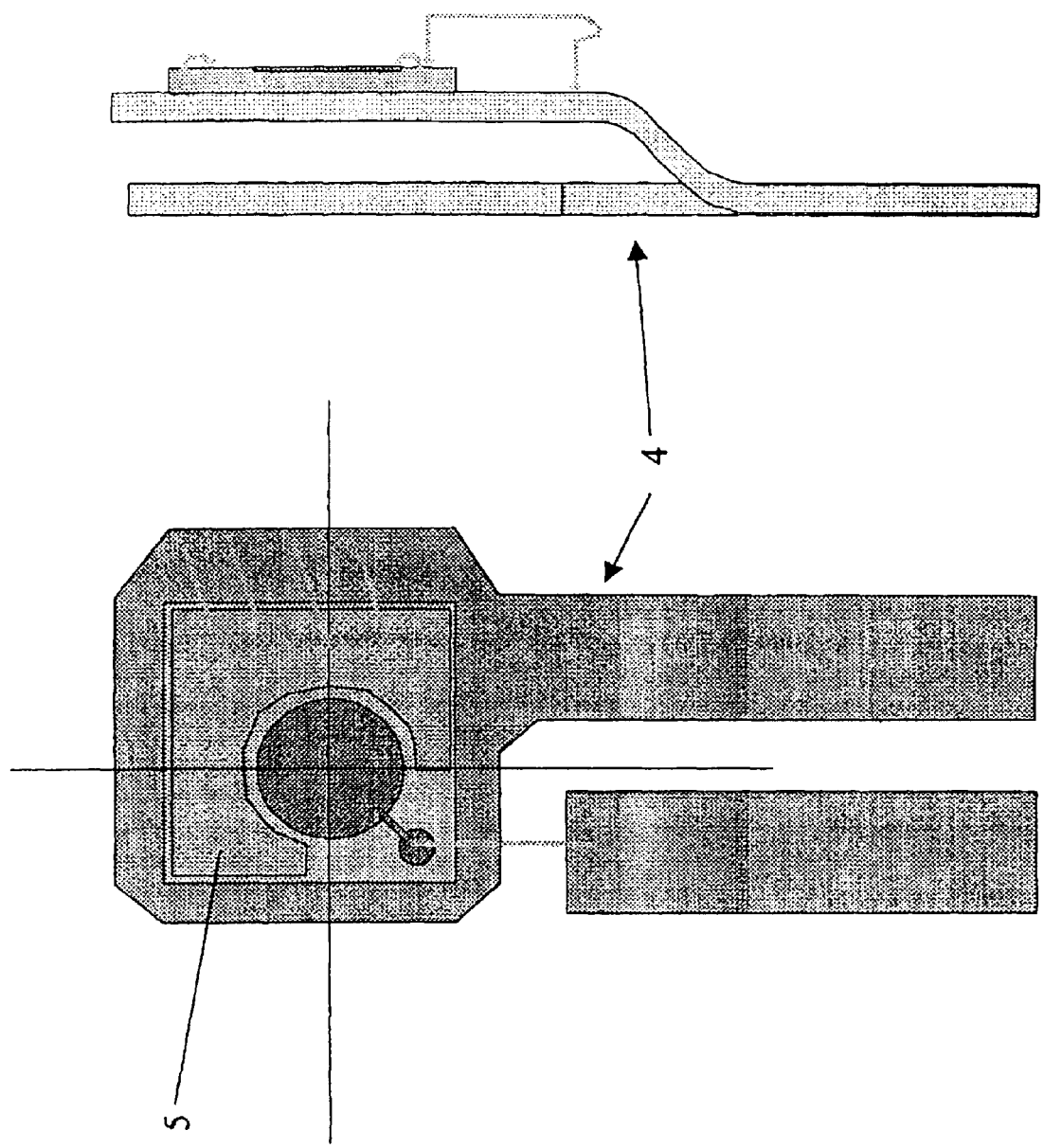
FIG. 10 shows a step of attaching a receiving element on a leadframe in a method for producing the receiving and coupling part shown in FIG. 9.

FIG. 10 shows the leadframe 4 with a receiver diode 5. It can be recognized in the sectional view that the leadframe is curved in the shape of an S.

Figure 11:
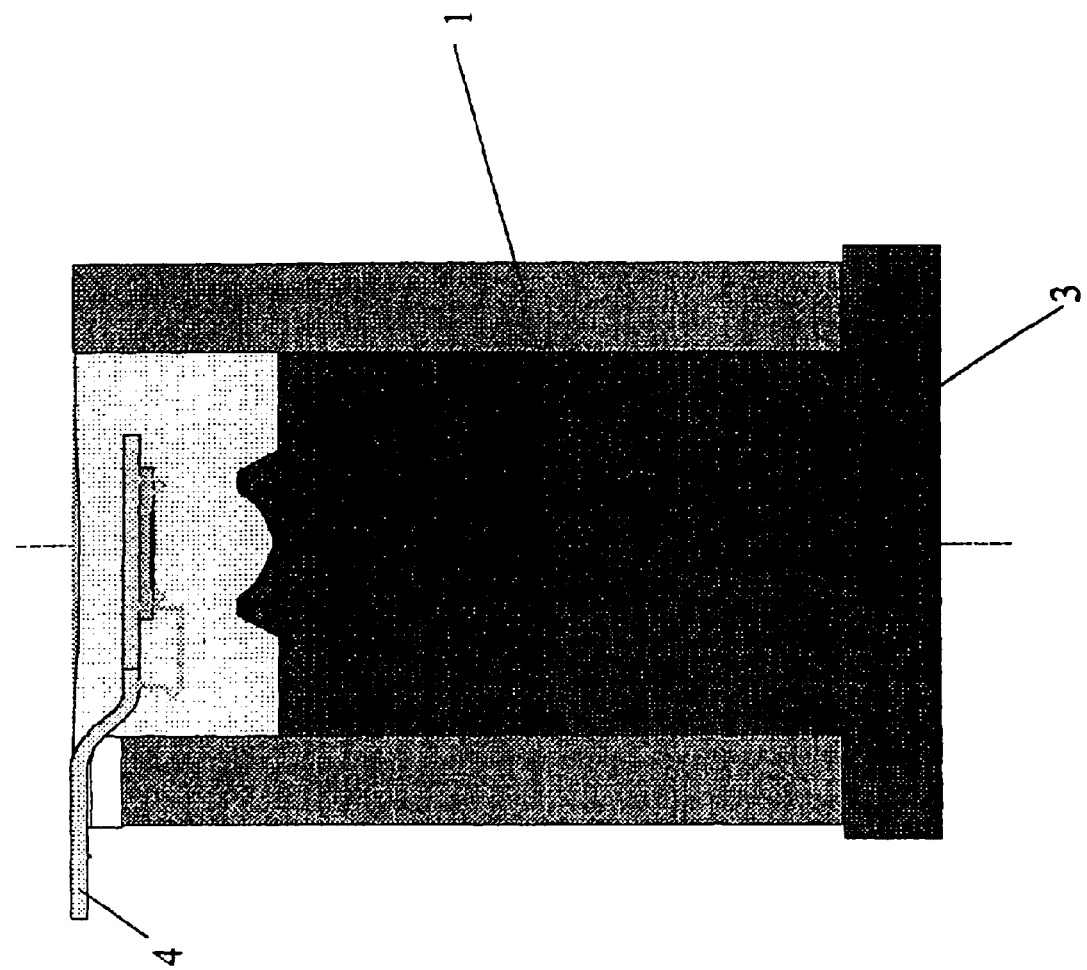
FIG. 11 shows a step in fabricating the receiving and coupling part shown in FIG. 9.

FIG. 11 shows the receiving and coupling part after placing the leadframe into the CAI housing. The CAI housing formed by the cylinder 1 has two open ends. The lower end is sealed by a stamp 3. The casting material is filled in using the upper end. After curing the casting material, the stamp is removed.

Figure 12:
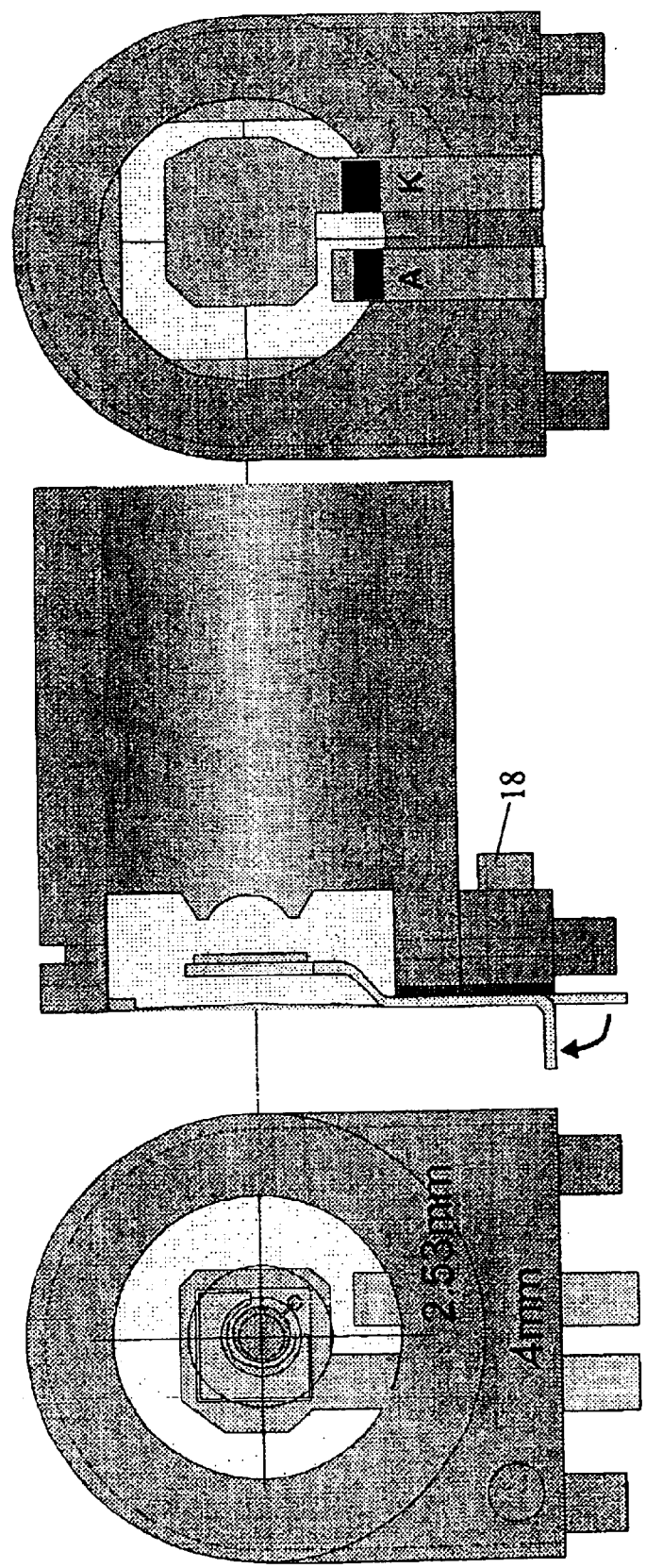
FIG. 12 shows an exemplary embodiment of a receiving and coupling part with a receiving element that has been slightly modified compared to the exemplary embodiment represented in FIG. 9.

FIG. 12 shows a slight alternative development of the CAI housing of FIG. 11 wherein additional passive aligning elements 18 are provided.

Figure 13:
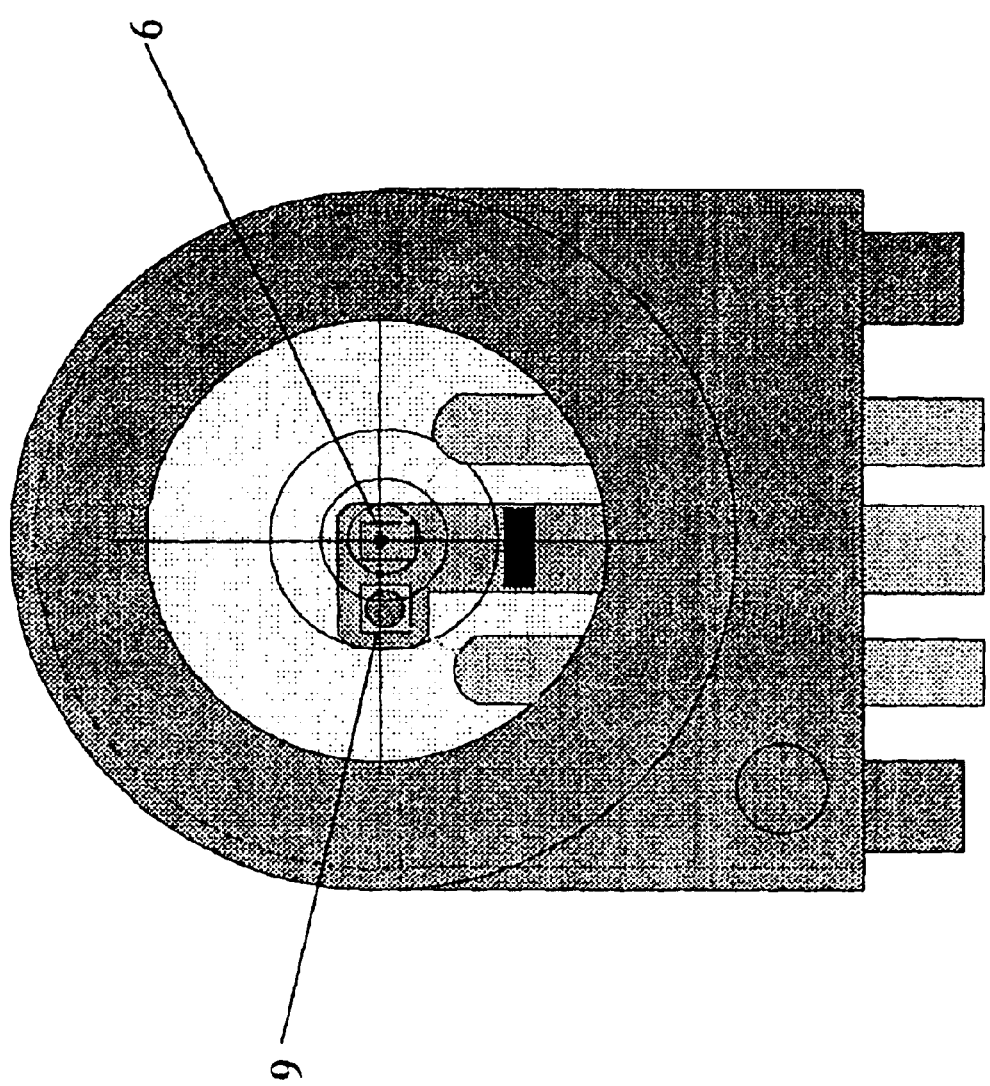
FIG. 13 is a front view of a receiving and coupling part having a carrier with both a transmission diode and a monitor diode.

FIG. 13 shows an exemplary embodiment in which a monitor diode 9 is attached to the leadframe in addition to a transmission diode 6.

Figure 14:
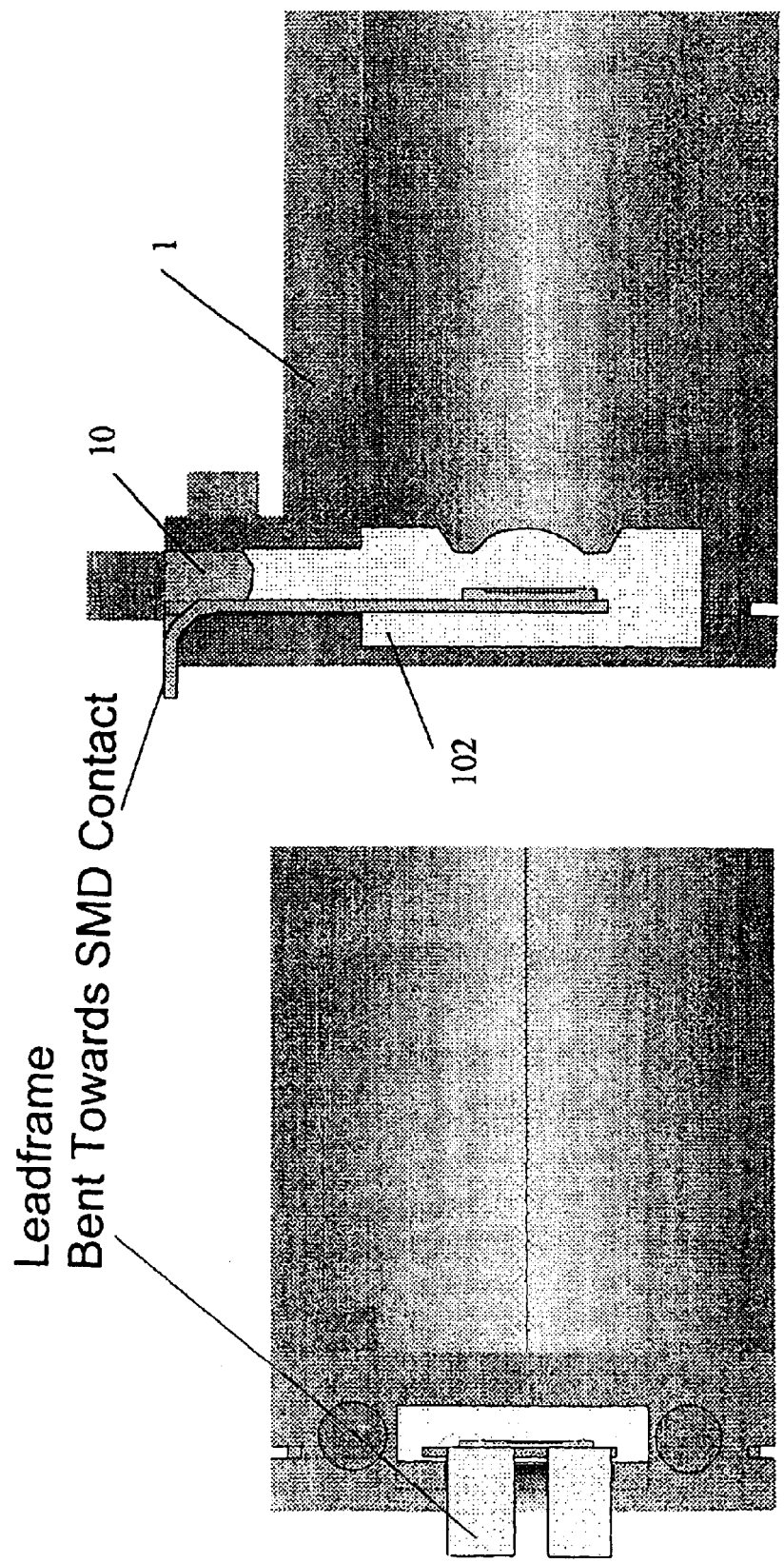
FIG. 14 shows an alternative development of a receiving and coupling part with a planar carrier.

In the exemplary embodiment shown in FIG. 14, the leadframe is disposed perpendicular to the optical axis. But the leadframe is constructed planar. Accordingly, it is inserted into the cylindrical recess 102 by way of a side opening 10 in the wall of the cylinder 1. A filling with casting material also occurs by way of opening 10.

Figure 15:
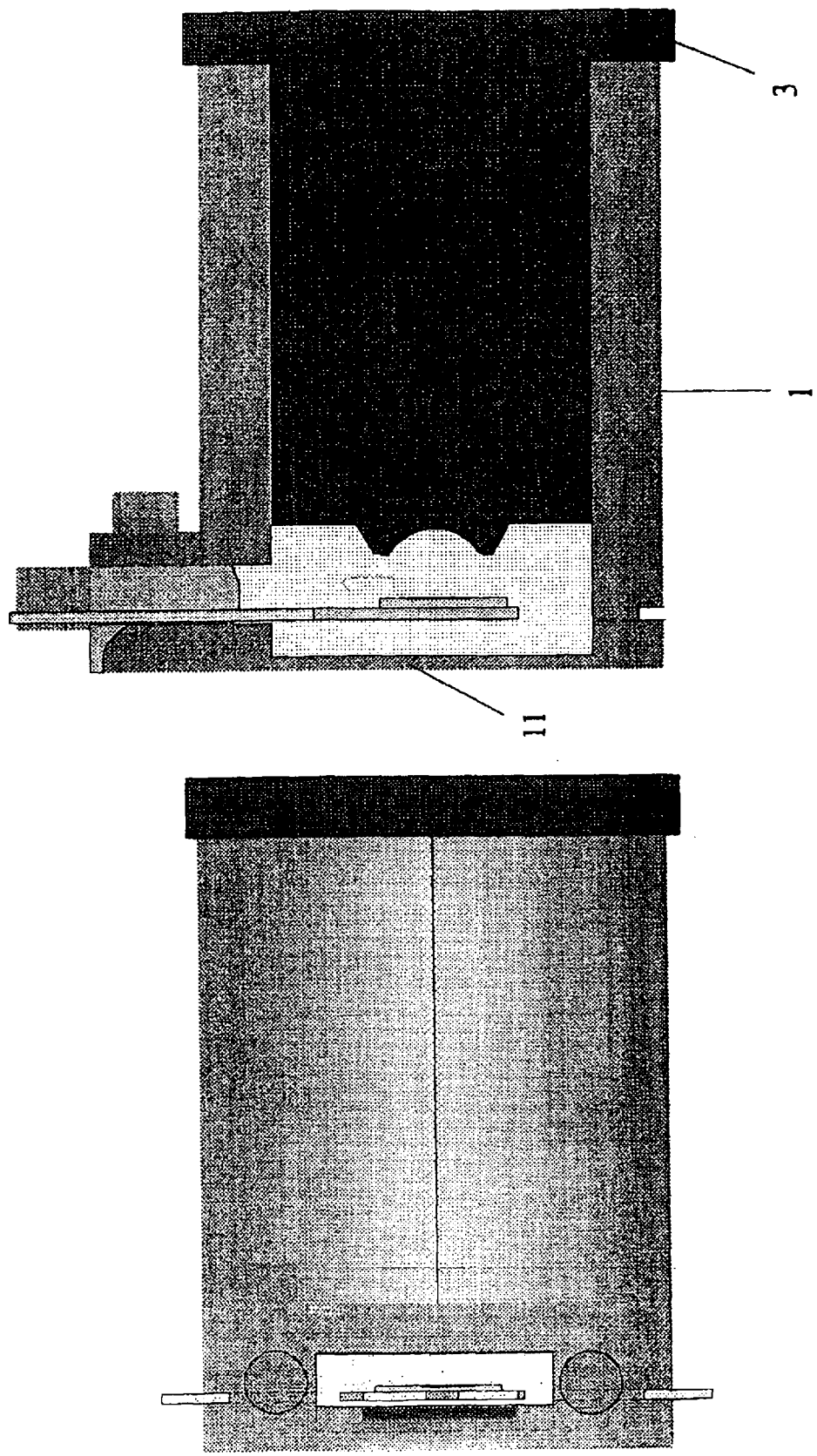
FIG. 15 are side and sectional views of the receiving/ coupling part represented in FIG. 14 during the fabrication thereof.

FIG. 15 shows the receiving and coupling part subsequent to the introduction of a stamp 3 on one end of the cylinder 1. In order to provide a cavity for filling, the other end of the cylinder is sealed with a cap 11.

Figure 16:
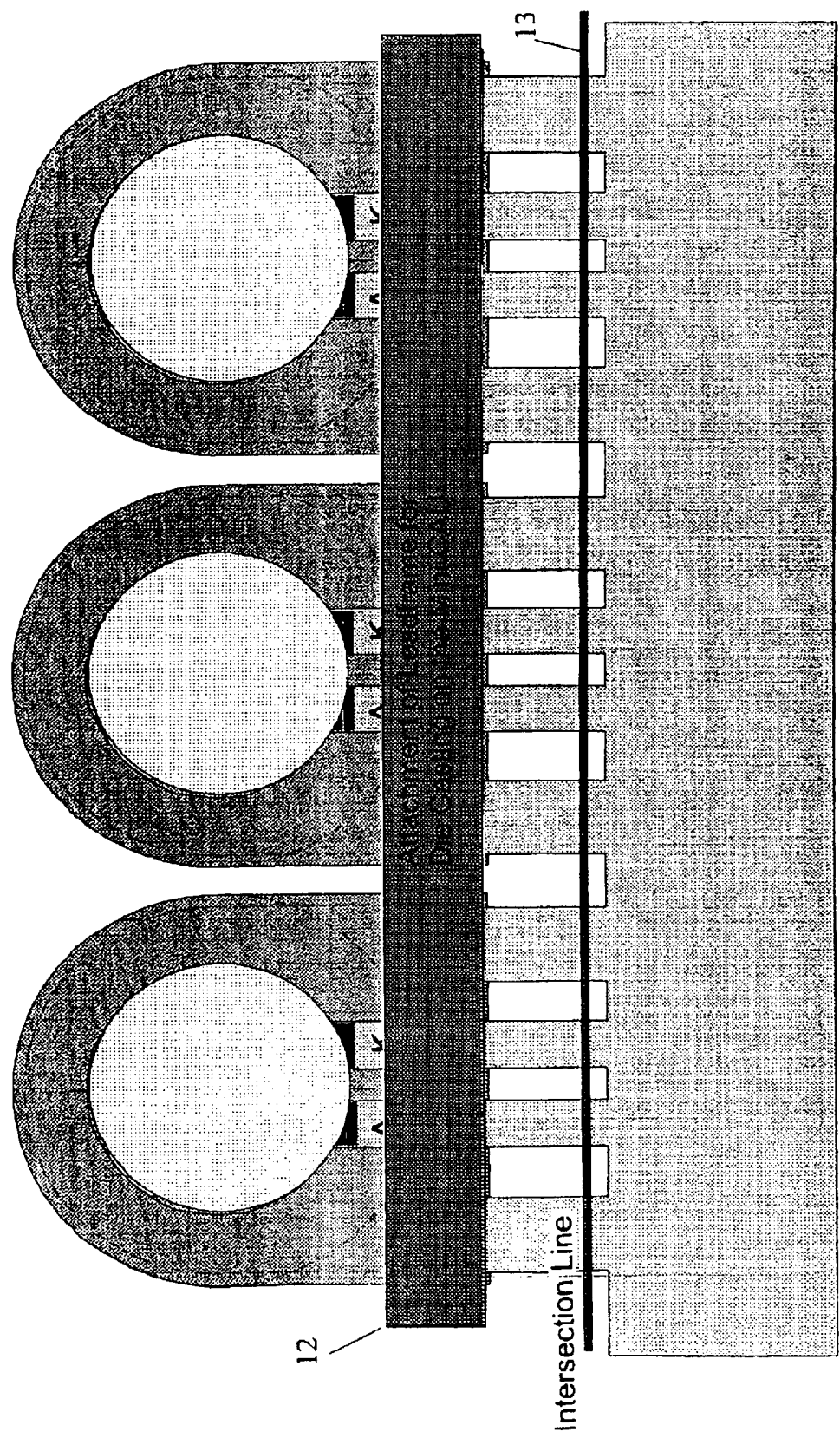
FIG. 16 shows a step in the fabrication of several receiving and coupling parts.
Figure 17:
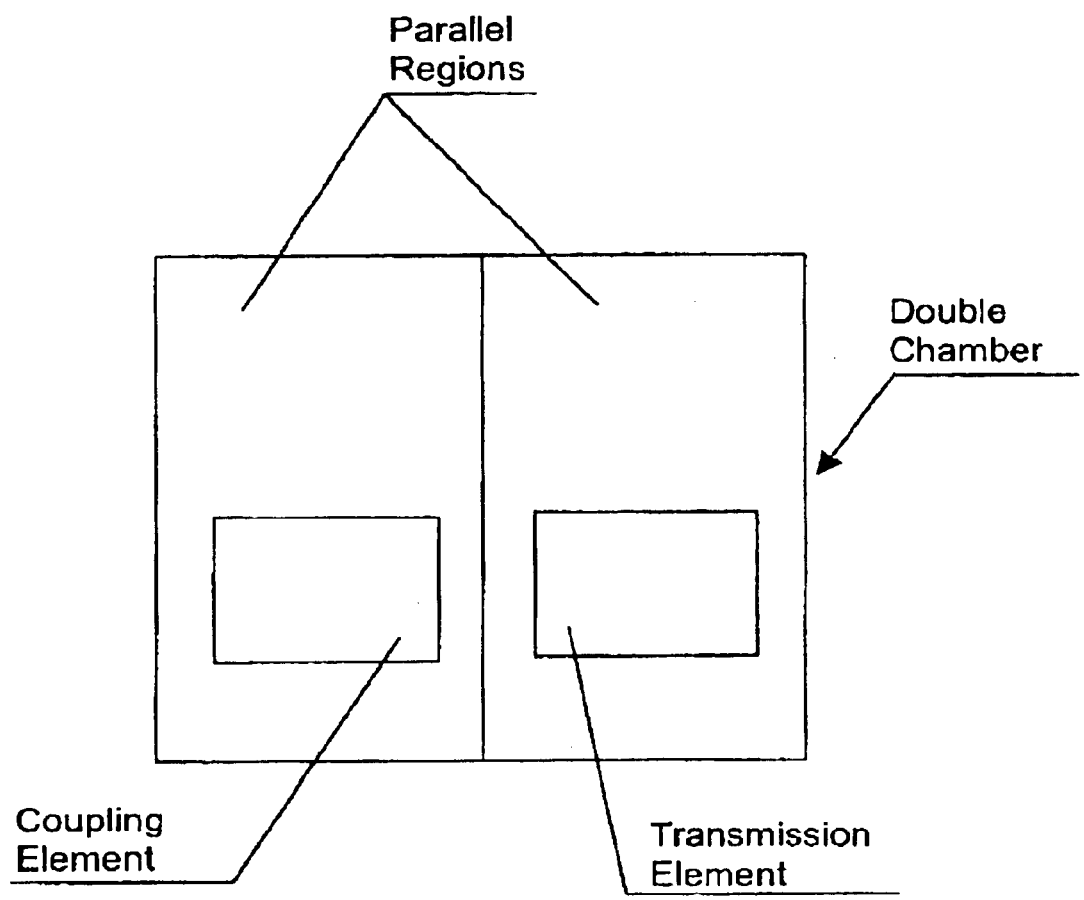
FIG. 17 is a schematic view of a double chamber according to the invention with parallel regions wherein a coupling element and a transmission element are configured in separate ones of the parallel regions.

Lastly, FIG. 16 shows a step in a method in which a common leadframe is used for several CAI housings. Subsequent to bending the leadframe legs using a press element 12, the legs are separated along a cut line 13.

It should be noted that the invention is not limited to the described exemplary embodiments, but encompasses modifications and variations that fall within the scope of protection defined by the claims.

We claim:

1. A receiving and coupling part, comprising:
   a carrier with an opto-electronic transmission and/or reception element, said carrier being embodied as a leadframe;
   an opening for inserting said carrier;

a casting material surrounding said transmission and/or reception element;

a coupling region for coupling an optical fiber; and a cylindrical recess having a first end and a second end, said cylindrical recess having an overall length and a given diameter, said given diameter being constant along said overall length;

said first end of said cylindrical recess containing said transmission and/or reception element; and said second end of said recess for receiving and coupling an optical fiber.

2. The receiving and coupling part according to claim 1, wherein:

said cylindrical recess has a first open end forming said opening for inserting said carrier; and said cylindrical recess has a second open end forming for receiving and coupling of said optical fiber.

3. The receiving and coupling part according to claim 1, further comprising:

a wall defining said cylindrical recess;

said cylindrical recess extending along a longitudinal axis;

said opening for inserting said carrier being formed in said wall of said cylindrical recess and extending substantially perpendicular to said longitudinal axis of said cylindrical recess.

4. The receiving and coupling part according to claim 1, further comprising an electrically conductive plastic material.

5. The receiving and coupling part according to claim 1, further comprising a coating of an electrically conductive layer.

6. The receiving and coupling part according to claim 1, wherein said cylindrical recess has an inner diameter corresponding to an outer diameter of said optical fiber to be coupled.

7. The receiving and coupling part according to claim 1, wherein said leadframe enables said transmission and/or reception element to be electrically contacted.

8. The receiving and coupling part according to claim 7, wherein:

said cylindrical recess has an optical axis; and said leadframe longitudinally extends parallel to said optical axis of said cylindrical recess.

9. The receiving and coupling part according to claim 7, wherein;

said cylindrical recess has an optical axis; and said leadframe extends vertically to said optical axis of said cylindrical recess.

10. The receiving and coupling part according to claim 7, wherein:

said leadframe is curved in an S shape having a region protruding into said cylindrical recess.

11. The receiving and coupling part according to claim 10, wherein:

said carrier is disposed at said first end of said cylindrical recess; and said first end of said cylindrical recess enables said casting material to be introduced.

12. The receiving and coupling part according to claim 7, wherein said leadframe is planar.

13. The receiving and coupling part according to claim 12, further comprising:

a cover element; and a wall defining said cylindrical recess;

said first end of said cylindrical recess accommodating said planar leadframe and being sealed by said cover element; and said opening for inserting said carrier being formed in said wall of said cylindrical recess.

14. The receiving and coupling part according to claim 12, further comprising:

a fiber stop ring formed in said casting material;

said fiber stop ring surrounding a lens; and said fiber stop ring preventing a face of said optical fiber from hitting said lens.

15. The receiving and coupling part according to claim 1, wherein said casting material forms an integrated lens.

16. The receiving and coupling part according to claim 1, further comprising:

a double chamber having parallel regions;

a coupling element; and a plurality of coupling regions;

said opto-electronic transmission and/or reception element being a transmission element;

said coupling element and said transmission element configured in separate ones of said parallel regions; and said plurality of coupling regions for coupling said coupling element and said transmission element with said optical fiber.

17. The receiving and coupling part according to claim 1, wherein:

said transmission and/or reception element is configured on said carrier; and said carrier does not have electrical driver circuits or reception circuits configured thereon.

18. The receiving and coupling part according to claim 17, further comprising a monitor diode configured on said carrier; said carrier having only said monitor diode and said transmission and/or reception element configured thereon.

19. The receiving and coupling part according to claim 17, in combination with a plug housing, wherein:

the receiving and coupling part includes an exterior wall with structures for fixing the receiving and coupling part to the plug housing.

20. A receiving and coupling part, comprising:

a carrier with an opto-electronic transmission and/or reception element;

an opening for inserting said carrier;

a casting material surrounding said transmission and/or reception element;

a coupling region for coupling an optical fiber; and a cylindrical recess having a first end and a second end;

said first end of said cylindrical recess containing said transmission and/or reception element;

said second end of said recess for receiving and coupling an optical fiber;

said carrier being a leadframe enabling said transmission and/or reception element to be electrically contacted; and said leadframe being curved in an S shape having a region protruding into said cylindrical recess.

21. A receiving and coupling part, comprising:

a carrier with an opto-electronic transmission and/or reception element;

an opening for inserting said carrier;

a casting material surrounding said transmission and/or reception element;

a coupling region for coupling an optical fiber; and a cylindrical recess having a first end and a second end, said cylindrical recess having an overall length and a given diameter, said given diameter being constant along said overall length;

said first end of said cylindrical recess containing said transmission and/or reception element;

said second end of said recess for receiving and coupling an optical fiber; and said casting material forming an integrated lens.

22. The receiving and coupling part according to claim 4, wherein said leadframe has ground pins and is configured such that the receiving and coupling part is electrically contacted only via said ground pins.

23. The receiving and coupling part according to claim 5, wherein said leadframe has ground pins and is configured such that the receiving and coupling part is electrically contacted only via said ground pins.

24. The receiving and coupling part according to claim 22, including receiving sockets for accommodating said ground pins.

25. The receiving and coupling part according to claim 23, including receiving sockets for accommodating said ground pins.

26. The receiving and coupling part according to claim 22, wherein the receiving and coupling part is electrically non-conductive or insulated from said leadframe at a location where said leadframe is led out of the receiving and coupling part.

27. The receiving and coupling part according to claim 23, wherein the receiving and coupling part is electrically non-conductive or insulated from said leadframe at a location where said leadframe is led out of the receiving and coupling part.

28. The receiving and coupling part according to claim 1, wherein said casting material completely surrounds said leadframe and said transmission and/or reception element disposed thereon.

29. The receiving and coupling part according to claim 1, wherein said optical fiber is inserted into an end of the receiving and coupling part and is a part of an optical plug.

30. The receiving and coupling part according to claim 1, wherein said transmission and/or reception element is electrically contacted exclusively via said leadframe.

* * * * *